US006665858B2

(12) United States Patent
Miyazaki

(10) Patent No.: US 6,665,858 B2
(45) Date of Patent: Dec. 16, 2003

(54) MANUFACTURING METHOD OF SEMICONDUCTOR DEVICE

(75) Inventor: Ko Miyazaki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 41 days.

(21) Appl. No.: 09/996,894

(22) Filed: Nov. 30, 2001

(65) Prior Publication Data

US 2002/0078430 A1 Jun. 20, 2002

(30) Foreign Application Priority Data

Dec. 7, 2000 (JP) ....................................... 2000-372745

(51) Int. Cl.[7] .............................................. G06F 17/50
(52) U.S. Cl. ........................................ 716/21; 716/19
(58) Field of Search ..................................... 716/1–21

(56) References Cited

U.S. PATENT DOCUMENTS

| 5,525,534 A | * | 6/1996 | Ikemasu et al. ............ 438/763 |
| 6,038,020 A | * | 3/2000 | Tsukuda .................. 356/237.5 |
| 6,334,209 B1 | * | 12/2001 | Hashimoto et al. ........... 716/21 |
| 6,391,501 B1 | * | 5/2002 | Ohnuma ...................... 430/22 |

* cited by examiner

Primary Examiner—Matthew Smith
Assistant Examiner—Sun James Lin
(74) Attorney, Agent, or Firm—Mattingly, Stanger & Malur, P.C.

(57) ABSTRACT

In a method of manufacturing a semiconductor integrated circuit capable of making gate electrode patterns of MOS transistors accurately in compliance with design data, exposure masks of the gate electrode patterns have the prior rendition of pattern shape assessment based on optical simulation. The assessment is carried out by optical simulation of a gate electrode pattern based on pattern data of layout design of the semiconductor integrated circuit. The model-based correction is applied to the optical simulation for the pattern shape assessment (S21–23). The model for the pattern shape assessment is formed by comparing test patterns with light intensity (S14) and defines compensation values correlative to dimensional differences of the light intensity patterns from the test patterns (S15). The test patterns are formed on a basis of test pattern data above different underlays on a test wafer and the light intensity patterns are formed by optical simulation based on test pattern data. This method enables to implement pattern verification in consideration of the influence of underlays on the etching rate, etc. which has not been considered in the conventional optical simulation.

7 Claims, 15 Drawing Sheets

BORDER REGION 35

FINISHED SHAPE →

OPC

VERIFICATION

MANUFACTURING METHOD OF SEMICONDUCTOR DEVICE

FIELD OF THE INVENTION

The present invention relates to a method of manufacturing a semiconductor integrated circuit which include MOS transistors, and particularly to a method of making a gate electrode pattern accurately in compliance with design data.

BACKGROUND OF THE INVENTION

In gaining trends of the microstructuring process of semiconductor integrated circuits, attempts of forming semiconductor regional patterns narrower than the light wavelength often encounter the fluctuation of resulting pattern width against exposure mask patterns. In the case of the gate electrode of a MOS transistor, a wider gate electrode pattern and a resulting increased gate length cause the transistor to operate slower, whereas a narrower gate electrode pattern and a resulting decreased gate length increase the leakage current. Accordingly, the gate electrode pattern of a MOS transistor affects the transistor characteristics significantly.

On this account, for making an intended gate electrode pattern, it is desirable to have the prior simulation-based assessment of the pattern which will be made on a basis of a mask pattern. A variety of test patterns including isolated lines, line bases and line ends of various dimensions are prepared. Masks of these test patterns are used for transfer, etching, etc. in working a wafer, and the dimensions of resulting patterns such as the width are measured at certain positions. The difference of the measured value from the result of optical simulation which is based on design data of the test pattern is evaluated to be a compensation value for the pattern resulting from the simulation, and it is shaped into a model (model expression). In carrying out the simulation for a layout pattern or mask pattern, the result of correction with the model is released as a result of optical simulation.

However, the test pattern used to make the above-mentioned model deals with the pattern shape and working of only single layer and does not consider the influence of its underlay. Specifically, the test pattern is formed as a single-layer film on a mirror wafer or a uniform multi-layer film, and is different from a multi-layer pattern of a semiconductor integrated circuit in which individual regions have different structures. As mentioned above, models used at present are made on the premise of single-layer films and made on a uniform material such as usual mirror wafers, and therefore actual products are partially different from the result of optical simulation.

On this account, the above-mentioned simulation is deficient in reliability and can be used only as assistant means for creating pattern data of exposure masks of gate electrode patterns or for verifying the proximity effect correction.

It is an object of the present invention to provide a method of manufacturing a semiconductor integrated circuit which is capable of making gate electrode patterns of MOS transistors accurately in compliance with design data.

These and other objects and novel features of the present invention will become apparent from the following description taken in conjunction with the accompanying drawings.

SUMMARY OF THE INVENTION

Among the affairs of the present invention disclosed in this specification, representatives are briefed as follows.

The inventive method of manufacturing a semiconductor integrated circuit having a MOS transistor includes a step of exposing a semiconductor substrate to a gate electrode pattern of the MOS transistor through an exposure mask which has the prior rendition of pattern shape assessment based on optical simulation. The pattern shape assessment is carried out by optical simulation of a gate electrode pattern based on pattern data of layout design of the semiconductor integrated circuit. The model-based correction is applied to the optical simulation for the pattern shape assessment. The model for the pattern shape assessment is formed by comparing test patterns with light intensity patterns and defines compensation values correlative to dimensional differences of the light intensity patterns from the test patterns. The test patterns are formed on a basis of test pattern data above different underlays on a test wafer and the light intensity patterns are formed by optical simulation based on test pattern data.

The assessment is based on the use of test patterns depending on different vertical structures of individual underlying layers, in contrast to the conventional case where a same test pattern is used for different underlays of idea semiconductor integrated circuit. For example, for a gate layer, different etching rates are used above an n-type semiconductor region (n+) and above a p-type semiconductor region (p+), and therefore test patterns are made separately for the n+ and p+ regions even if their pattern dimensions are equal. Optical simulation is carried out by selecting a model in consideration of the layout structure below the gate electrode pattern which is the subject of simulation.

The foregoing verification scheme takes account of the influence of underlay of pattern on the etching rate or the like, which has not been considered in the conventional optical simulation, in optical simulation by use of models based on multi-layer test patterns, whereby the simulation accuracy of gate electrode patterns can be improved. Accordingly, by using exposure masks of gate electrode patterns made under the foregoing verification for the manufacturing of a semiconductor integrated circuit, it becomes possible to form gate electrode patterns of MOS transistors accurately in compliance with design data.

By separating the effects of different underlays, such as the reflection (shift of exposure strength) and steps (defocus) which can be corrected directly in optical manner, from other effects such as etching rate, and making models based on the calculation by optical simulation from the reflectivity and step value, instead of being based on test patterns, for the affairs which can be corrected directly in terms of optical effect, or based on the calculation by optical simulation for individual affairs, it is possible to eliminate the need of models.

At a border section between different underlays, the model is not switched in discontinuous manner. Instead, a model of the worst value (a model of a large dimensional correction value), a model of the best value (a model of a small dimensional correction value), a model of a mean value of the best and worst values, a model of a continuous linear function of the best and worst values, etc. are prepared so as to be selected depending on the purpose of simulation. For example, in the case of automatic correction by proximity effect correction based on the optical simulation result, the use of worst value is not desirable due to the possibility of over-correction attributable to other error factors such as mask misalignment. In another case where optical simulation is used for pattern verification, the use of worst value is necessary. Based on this treatment of border section, the accuracy of simulation of layout pattern is further improved.

For a border section, in case an accurate model cannot be made due to the variation of thickness at a step or the presence of halation, it is alternatively possible to apply additionally a geometrical operation such as dimensional shift by a constant value.

DETAILED DESCRIPTION OF THE PREFERRED EMBODIMENTS

1. Single-Layer Test Pattern

The inventive method of manufacturing a semiconductor integrated circuit uses an exposure mask of gate electrode pattern, which is assumed to be made with the rendition of assessment based on optical simulation. The pattern verification process for the assessment uses a model, which has been made from a multi-layer test pattern, for the correction of simulation result. The conventional single-layer test pattern to be compared with the multi-layer test pattern will be explained first.

Figure 2:
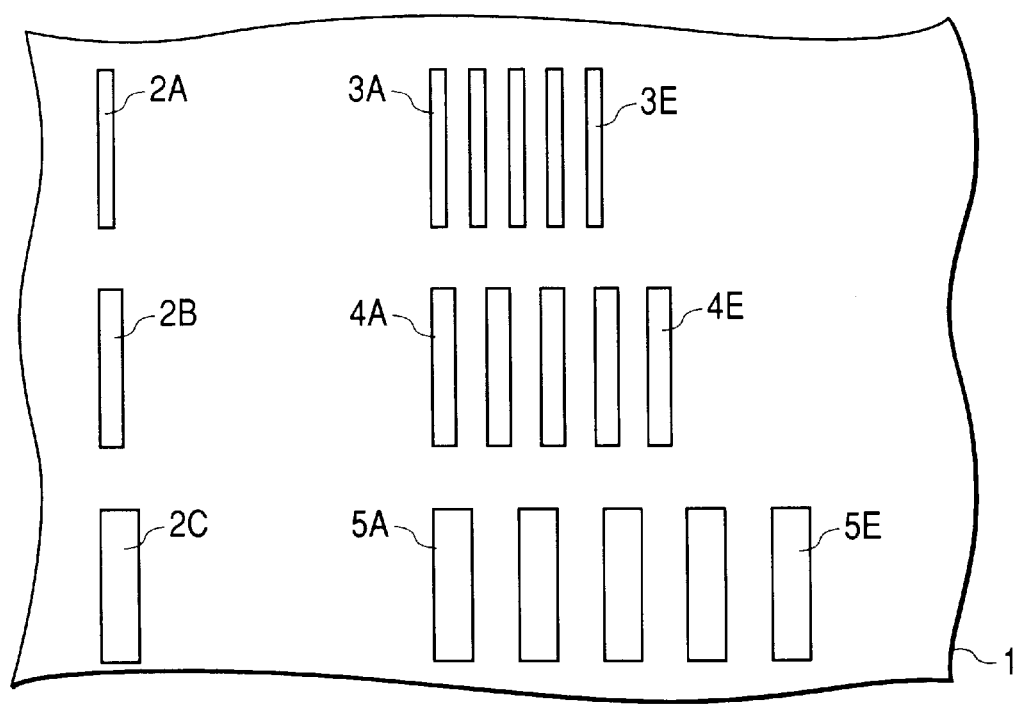
FIG. 2 is a diagram used to explain examples of single-layer test pattern.

FIG. 2 shows an example of single-layer test pattern. The single-layer test pattern includes isolated lines 2A through 2C of different widths and parallel lines 3A through 3E, 4A through 4E, and 5A through 5E of different widths and spacings, which are all formed on a mirror wafer (a monocrystalline silicon wafer having no formation of lateral regions such as wells nor vertical layers) 1. These lines are each formed of a single-layer film or a uniform multi-layer film on the silicon wafer. The laminated underlying structure inclusive of semiconductor regions, insulating layers and wiring layers associated with a multi-layer semiconductor integrated circuit is not considered in the explanation. The test pattern made on the wafer will undergo the measurement of width.

Figure 3:
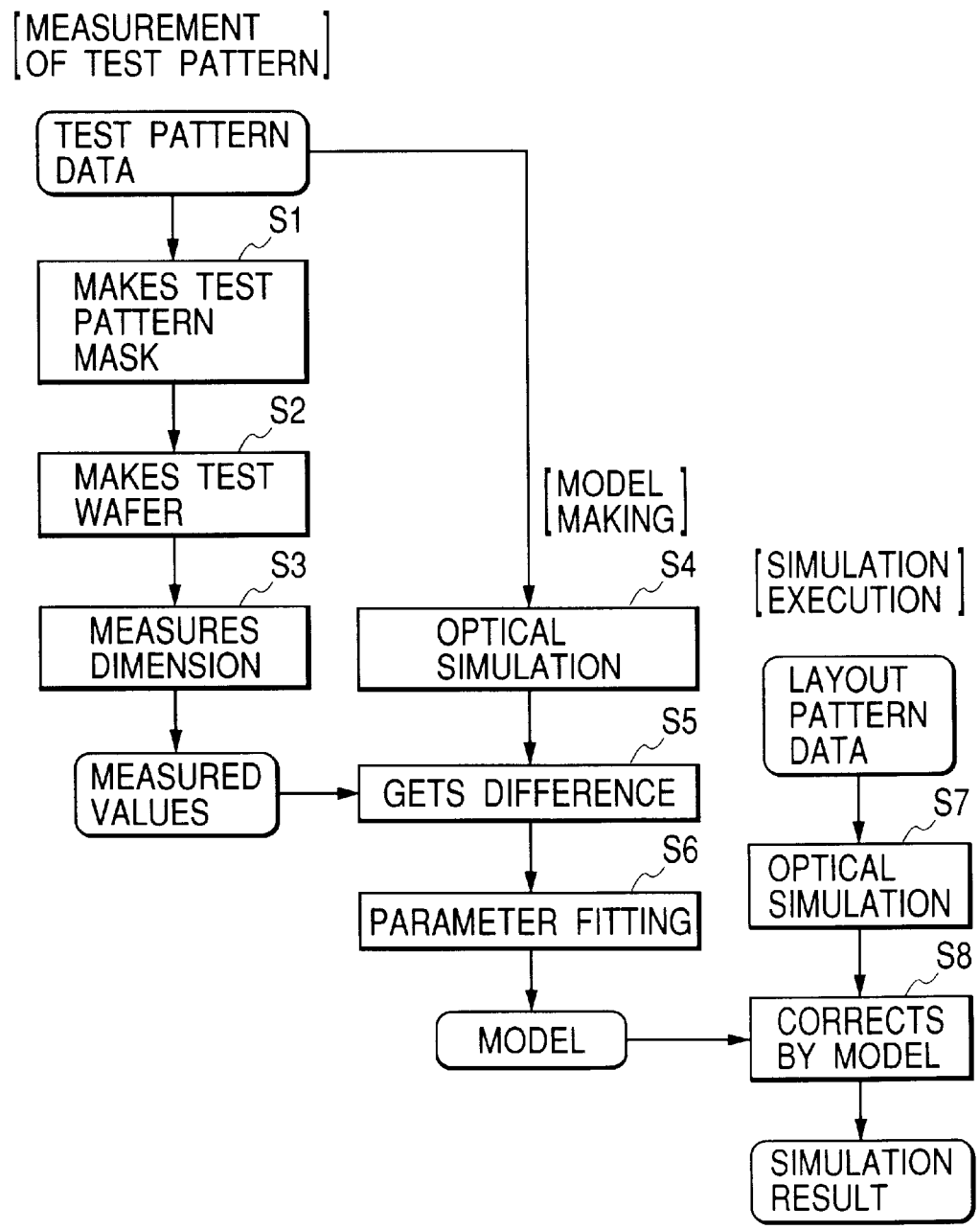
FIG. 3 is a flowchart showing the procedure of pattern verification process which uses a model made from a single-layer test pattern.

FIG. 3 shows the procedure of pattern verification process which uses a model made from a single-layer test pattern.

A test pattern mask is made by using single-layer test pattern data: (S1). The mask is used to implement the exposing and etching processes on a uniform substrate, e.g., mirror wafer, to make a test wafer having a single-layer test pattern: (S2). The test pattern formed on the test wafer undergoes the width measurement at multiple positions: (S3). Optical simulation is conducted by using the test pattern data to make a light intensity pattern: (S4). The light intensity pattern represents the light intensity distribution of the image of a pattern which is assumed to be formed on the wafer by use of a photomask which is based on the test pattern data. The difference of the test pattern from the light intensity pattern is evaluated: (S5), and a model, with compensation value which fits the parameter of optical simulation being derived from the difference, is made: (S6). The model has the compensation value of light intensity pattern which is to be compensated depending on the shape or size of the test pattern.

For the verification by use of layout pattern data of the semiconductor integrated circuit, optical simulation is conducted by using the layout pattern data: (S7), and a resulting light intensity pattern is corrected by using the model: (S8). In consequence, a layout pattern, which is corrected within the range of the empirical model based on the single-layer test pattern, is obtained in terms of a light intensity pattern. The resulting light intensity pattern will be used to verify the photomask pattern or proximity effect correction. However, light intensity patterns obtained through the process of step S8 are based on single-layer test patterns, and therefore they deviate in many cases from actual patterns of semiconductor integrated circuits of multi-layer structure.

2. Multi-Layer Test Patterns

Figure 4:
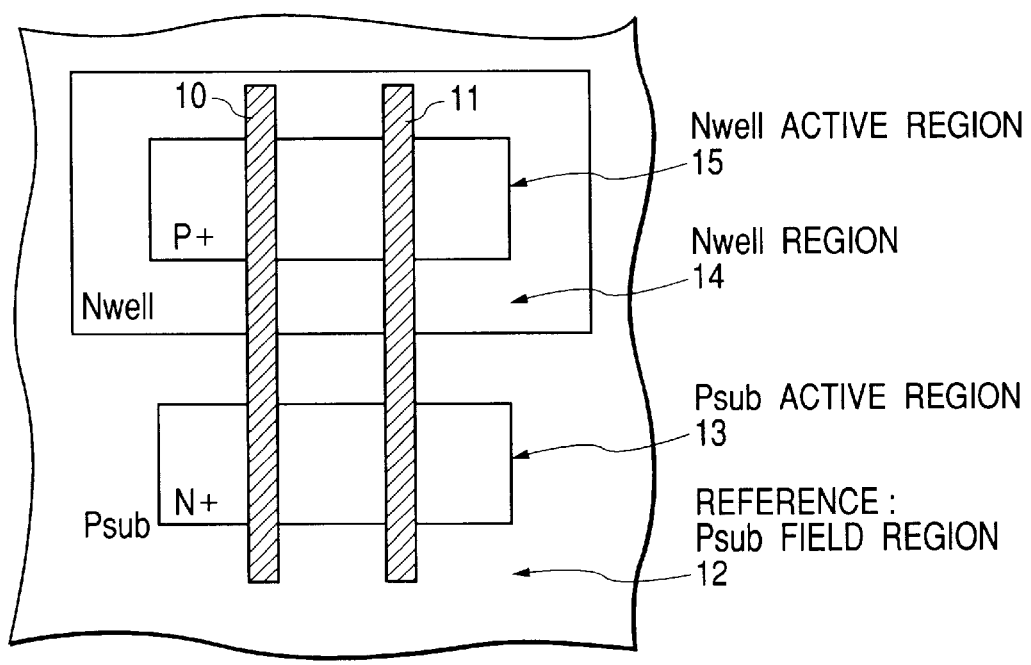
FIG. 4 is a diagram used to explain the difference of underlays to be considered in dealing with multi-layer structures of a semiconductor integrated circuit.

FIG. 4 shows different underlays in the multi-layer structure of a semiconductor integrated circuit.

In regard to poly-silicon wiring patterns 10 and 11 in this example, the reflectivity of underlays is different among a p-type semiconductor substrate (Psub field region) 12, an n+ semiconductor region (Psub active region) 13, an n-type well region (Nwell region) 14, and a p+ semiconductor region (Nwell active region) 15. In addition, the upper layers have different etching rates depending on the impurity concentration and conductivity type of underlays among the n+ semiconductor regions (Psub active regions) 12 and 13, the n-type well region (Nwell region) 14, and the p+ semiconductor region (Nwell active region) 15.

Due to the differences in reflectivity and etching rate depending on the underlay structure of the multi-layer structure of a semiconductor integrated circuit as shown in FIG. 4, multi-layer test patterns are used to obtain empirical models which comprehend these differences.

Figure 5:
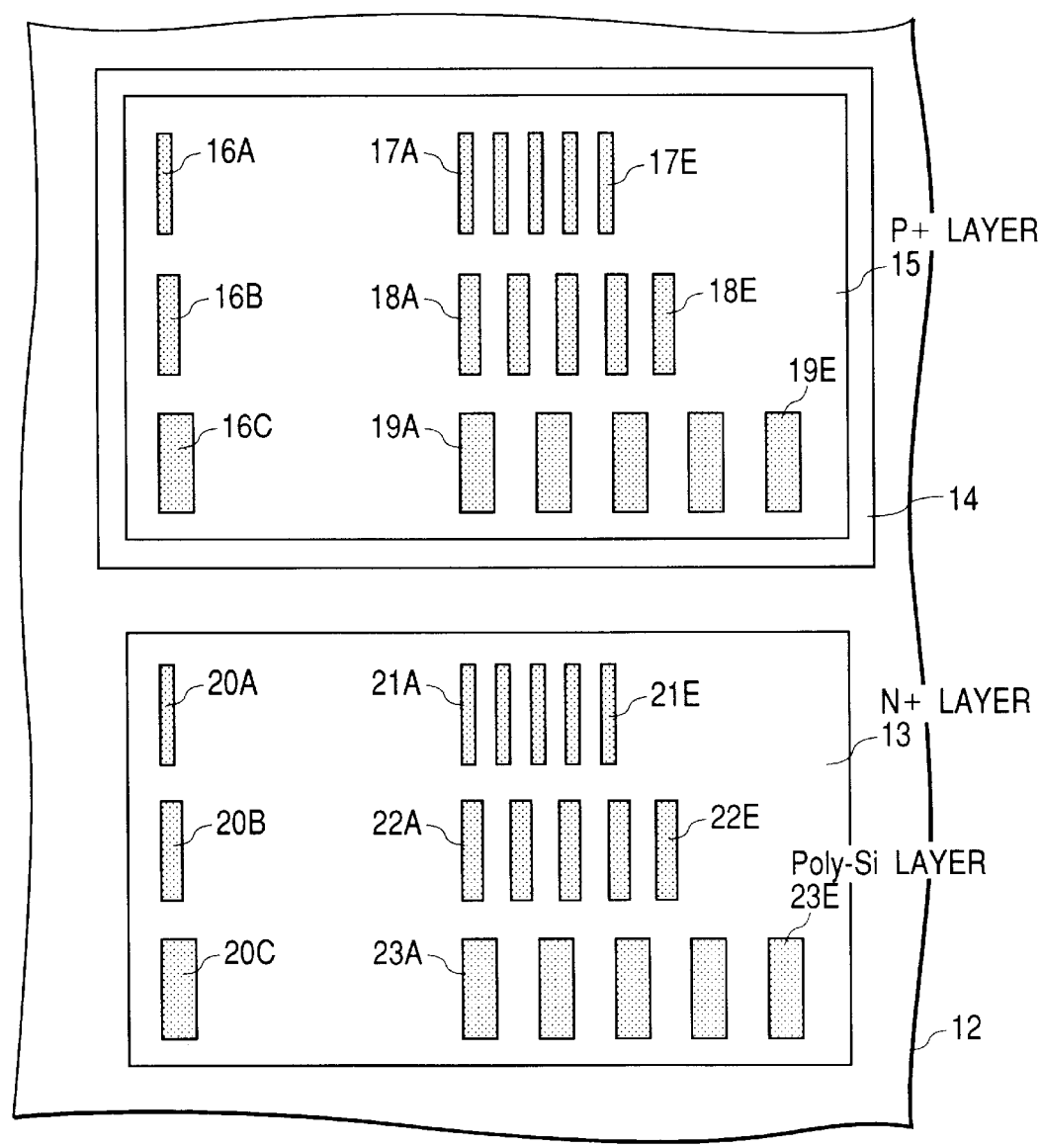
FIG. 5 is a diagram used to explain examples of multi-layer test pattern.

FIG. 5 shows an example of multi-layer test pattern which corresponds to the single-layer test pattern of FIG. 2. This example is assumed to have underlying layers of different working dimensions of etching and has its effects of reflection and defocus attributable to the difference in material and thickness of underlying layers treated by optical simulation in advance instead of using the test pattern.

Underlying regions with different working dimensions of etching include a Psub active region (n+ layer) 13 formed in the Psub field region 12 and an Nwell active region (p+ layer) 15 formed in the Nwell region 14. Formed in the Psub active region (n+ layer) 13 as a poly-silicon layer include isolated lines 16A–16C of different widths and parallel lines 17A–17E, 18A–18E, and 19A–19E of different widths and spacings. Formed in the Nwell active region (p+ layer) 15 as a poly-silicon layer include isolated lines 20A–20C of different widths and parallel lines 21A–21E,22A–22E, and 23A–23E of different widths and spacings. The multi-layer test pattern is formed on a basis of test pattern data to make a test wafer.

Figure 6:
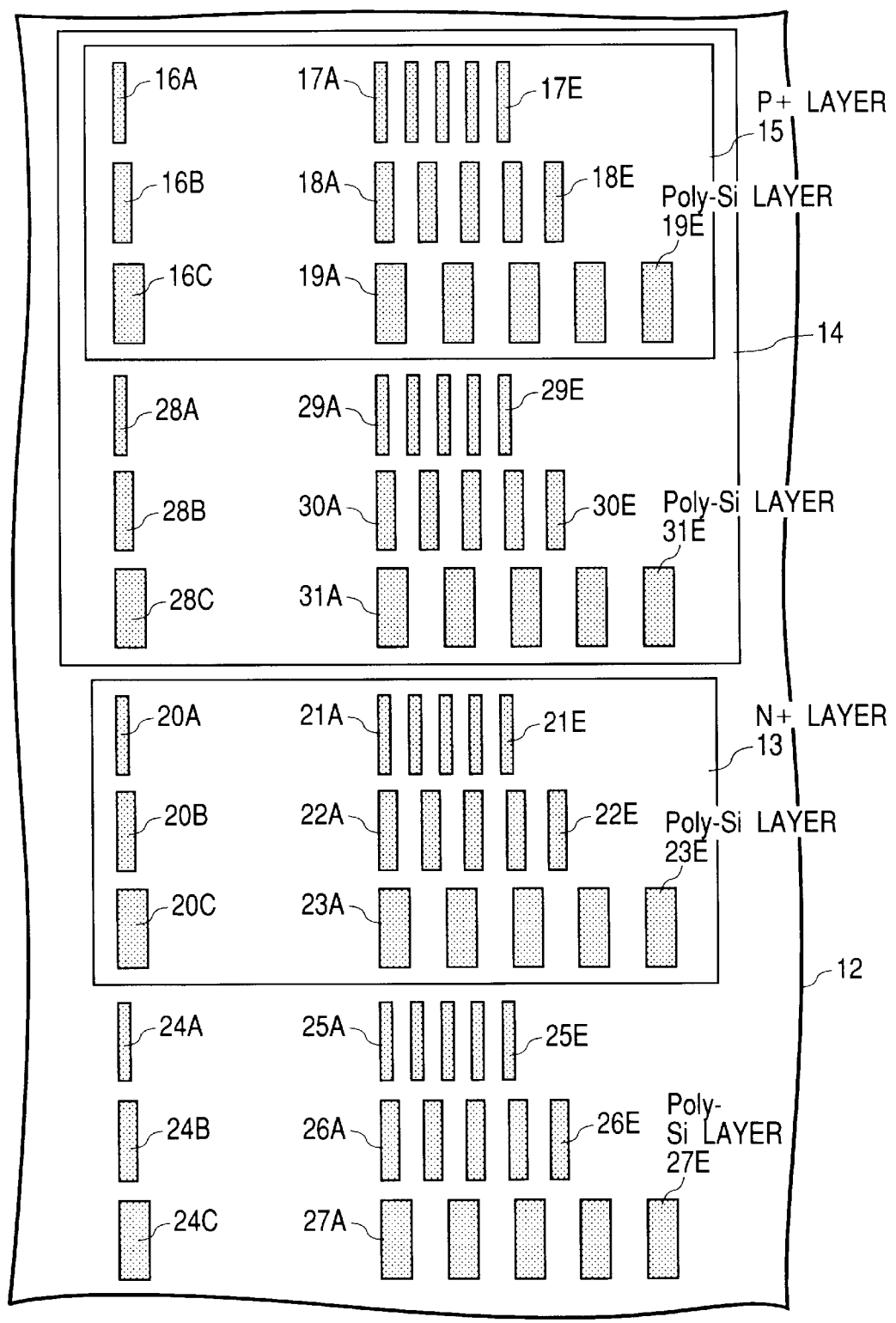
FIG. 6 is a diagram used to explain other examples of multi-layer test pattern.

FIG. 6 shows another example of multi-layer test pattern which corresponds to the single-layer test pattern of FIG. 2. This example differs from that of FIG. 5 in that the difference of reflection attributable to the difference in material and thickness of underlying layers is taken into consideration as well as the difference of working dimensions of etching. Measurement of dimensions can be skipped at the pattern positions where the effect of reflection is tested. It is possible to test the effect of a border section of regions by using a special test pattern. The effect a border section of regions is explained later.

In the example of FIG. 6, underlying regions with different working dimensions of etching include a Psub field region 12, a Psub active region (n+ layer) 13, an Nwell region 14, and an Nwell active region (p+ layer) 15. The same test pattern as that of FIG. 5 is made in the Psub active region (n+ layer) 13 and Nwell active region (p+ layer) 15. Formed in the Psub field region 12 as a poly-silicon layer include isolated lines 24A–24C of different widths and parallel lines 25A–25E, 26A–26E, and 27A–27E of different widths and spacings. Formed in the Nwell region 14 as a poly-silicon layer include isolated lines 28A–28C of different widths and parallel lines 29A–29E,30A–30E, and 31A–31E of different widths and spacings. This multi-layer test pattern is formed on a basis of test pattern data to make a test wafer.

3. Pattern Verification

Figure 1:
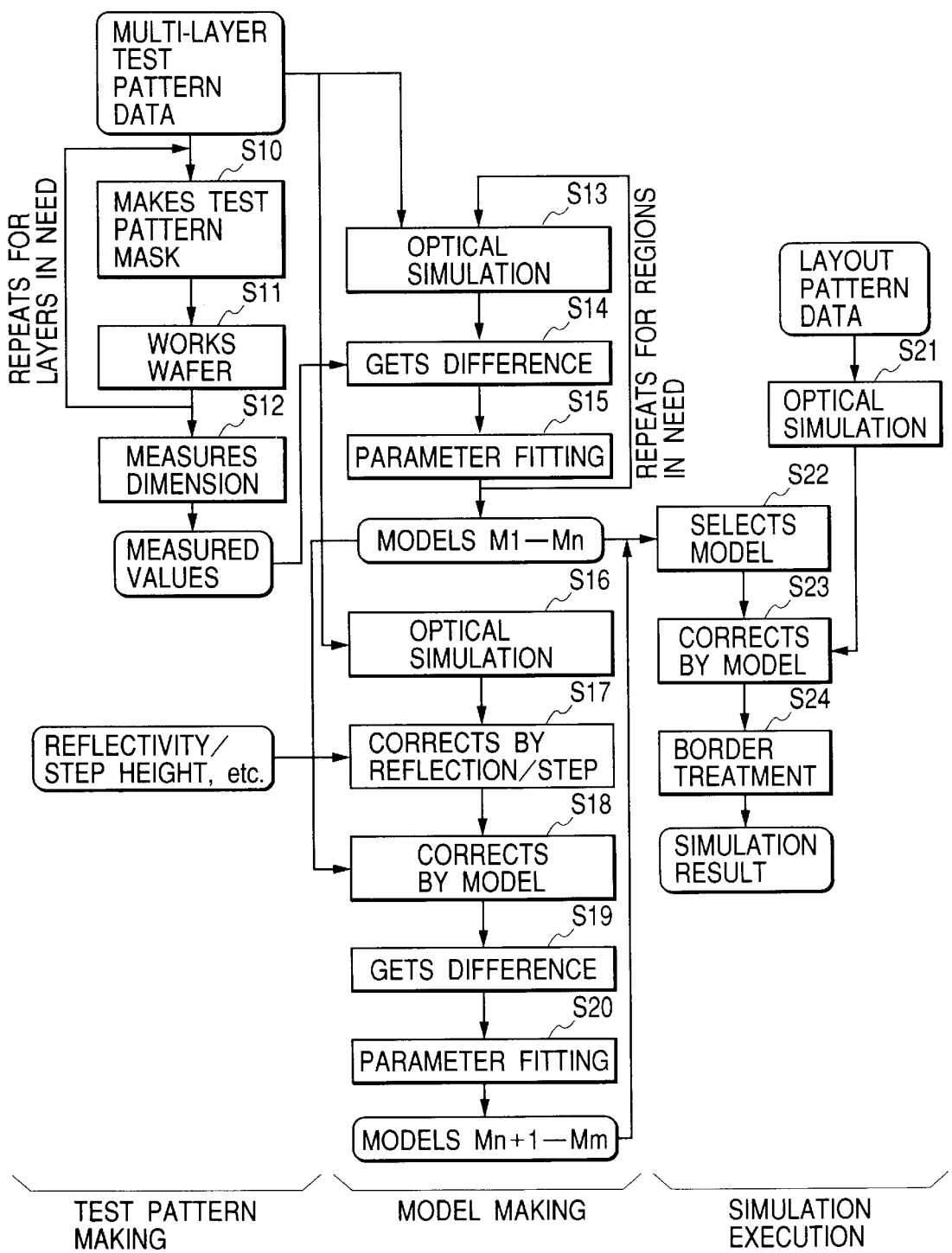
FIG. 1 is a flowchart showing a pattern verification process which includes the making of multi-layer test patterns, making of models, and execution of optical simulation.

FIG. 1 shows by flowchart the pattern verification process ranging from the creation of multi-layer test patterns to optical simulation which uses a model.

Initially, a test pattern mask (exposure mask) is made on a basis of multi-layer test pattern data: (S10). The mask is used to work the semiconductor wafer inclusive of the exposure and etching: (S11). The steps S10 and S11 are repeated a number of times equal to the number of multi-layer test patterns in need thereby to make a test wafer having the multi-layer test patterns.

The test patterns formed on the test wafer undergo the measurement of dimensions including the width of isolated lines and parallel lines at multiple positions: (S12). Optical simulation is conducted by using the multi-layer test pattern data to make a light intensity pattern: (S13). The light intensity pattern represents the light intensity distribution of the image of a pattern which is assumed to be formed on the wafer by use of a photomask which is based on the multi-layer test pattern data. The difference of the multi-layer test pattern (measured values) from the light intensity pattern is evaluated: (S14), and a model, with its compensation value which fits the parameter of optical simulation being derived from the difference, is made: (S15). The model has the compensation value of light intensity pattern which is to be compensated depending on the shape or size of the test pattern.

The multi-layer test patterns are assumed to have underlying layers of different working dimensions of etching, and the influence of reflection attributable to the difference in material and thickness of underlying layers is not considered as explained in connection with FIG. 5. Models M1 through Mn are made in the following process. The models M1–Mn have data of compensation values for increasing or decreasing the pattern widths, determined by specifying the pattern widths and underlay structures.

The influence of reflection due to different underlays is treated by optical simulation in advance instead of using the test pattern as empirical model. Light intensity patterns are made by optical simulation from the multi-layer test pattern data: (S16). The light intensity patterns are rendered the correction of the influence of reflection caused by the difference in material and thickness of the underlying layers and the influence of steps: (S17), and the models are rendered the further correction: (S18). The differences of the corrected light intensity patterns from the original light intensity patterns obtained in step S16 are evaluated: (S19), and models, with their compensation values which fit the parameters of optical simulation being derived from the differences, are made: (S15). The resulting models Mn+1 through Mm have compensation values responsive to the underlay states which cause different etching rates and also compensation values responsive to the influence of reflection and step of underlying layers, determined by specifying the pattern widths and underlay structures.

For the verification of layout design pattern data of the semiconductor integrated circuit, optical simulation is conducted for each layer, which is defined by each mask pattern, by using the layout pattern data: (S21) thereby obtaining alight intensity pattern. For the light intensity pattern obtained for each layer, a model of the layer is selected: (S22). For example, in simulating a light intensity pattern for a mask pattern which defines a first poly-silicon layer, the underlay state of the poly-silicon wiring layer is recognized by making reference to the layout design pattern data, and a relevant model is selected. If the underlay of the first poly-silicon layer is not uniform, several models for different underlays are selected.

The light intensity pattern is corrected in accordance with the selected model: (S23). As to whether a model is selected from among the models M1 through Mn or from among the models Mn+1 through Mm is dependent on the content of simulation of step S21. Since the influence of reflection and step caused by the difference in material and thickness of underlying layers is substantially a factor which can be corrected optically, it is taken into account in the optical simulation of step S21 so that a model is selected from among the models M1–Mn. The calculation in consideration of the influence of reflection and step of the underlay must be carried out at each optical simulation independently, which gives rise to inefficiency of the verification process in some case. By selecting a model from among the models Mn+1 through Mm, the calculation of the reflection and step can be simplified at optical simulation.

Figure 7:
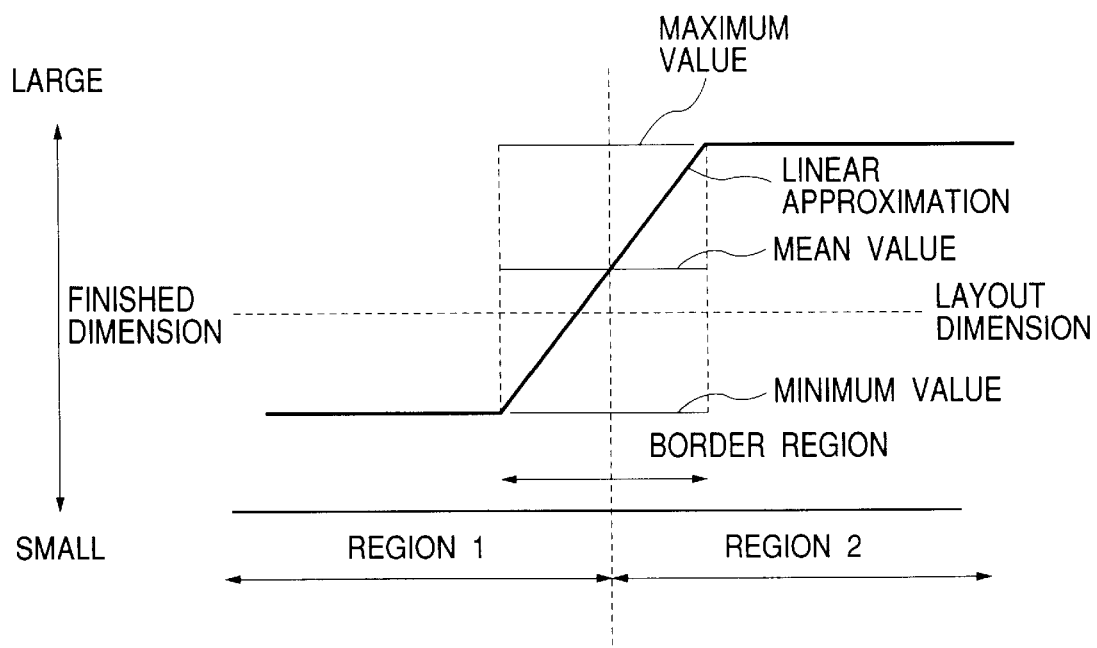
FIG. 7 is a diagram used to explain the application of model to a border region.
Figure 8A:
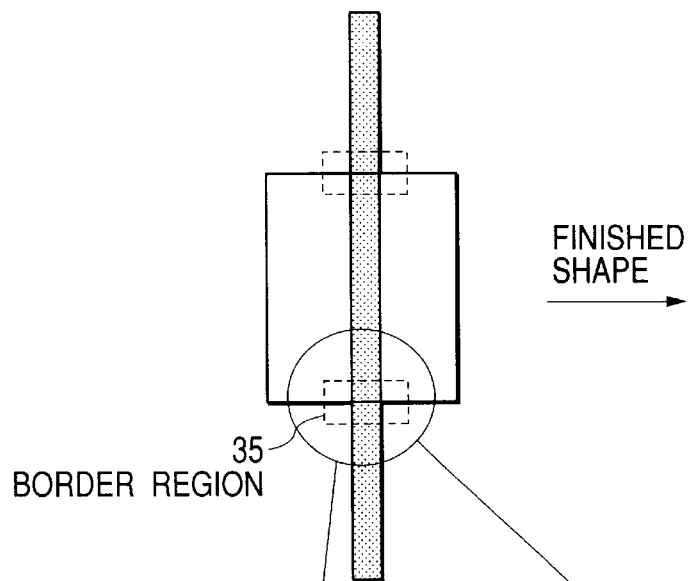
FIG. 8 is a set of diagrams used to explain the adoption of model for a border region, with a finished shape for a designed pattern being inferred, of a case of proximity effect correction and another case of pattern verification.
Figure 8B:
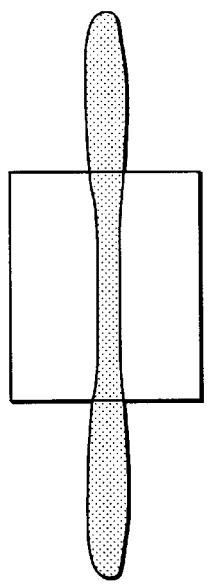
Figure 8C:
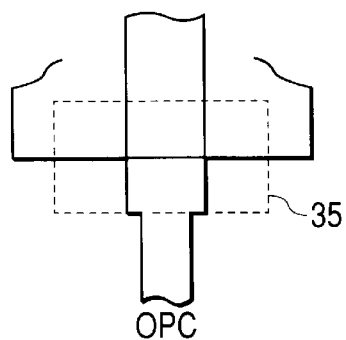
Figure 8D:
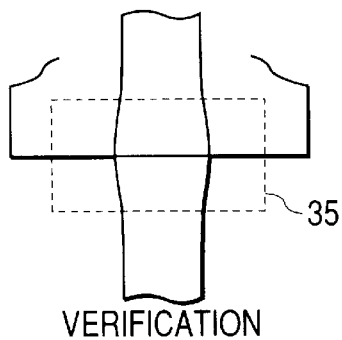

The treatment for the border section of regions of different applied models is implemented: (S24). The border section is subjected to the effect of different underlays of both regions and the influence of mask misalignment. On this account, it is occasionally desirable to implement the correction of border section by using a different model even though the underlay is the same. Specifically, as shown in FIG. 7, instead of switching the model in discontinuous manner at a border section with different underlays, the correction can be based on the selection from among a model with the worst value (a model with a large dimensional correction value), a model with the best value (a model with a small dimensional correction value), a model with a mean value of the best and worst values, a model with a continuous linear function of the best and worst values, etc. depending on the purpose of simulation. In a specific example shown in FIG. 8, in which a designed pattern shown by (A) results in a finished pattern (B), the use of the worst value is undesirable due to the possibility of over-correction caused by mask misalignment, etc. by the automatic correction of proximity effect correction (OPC) based on optical simulation result, but the use of the best value is recommended as shown by (C). In the case of using optical simulation for the verification of pattern, the use of the worst value is recommended so as to foster the appearance of the worst state as shown by (D).

According to the foregoing pattern verification process using models which are made from multi-layer test patterns, it is possible for optical simulation to comprehend the influence of underlay, such as the etching rate, which has not been considered in the conventional optical simulation, and consequently it is possible to improve the simulation accuracy of layout pattern.

Adopting the foregoing border treatment can further improve the simulation accuracy of layout pattern.

For a border section, in case accurate models cannot be made due to the variation of thickness at a step or the presence of halation, it is possible alternatively to apply additionally a figure working such as dimensional shift by a constant value.

4. Manufacturing of Semiconductor Integrated Circuit

Figure 9:
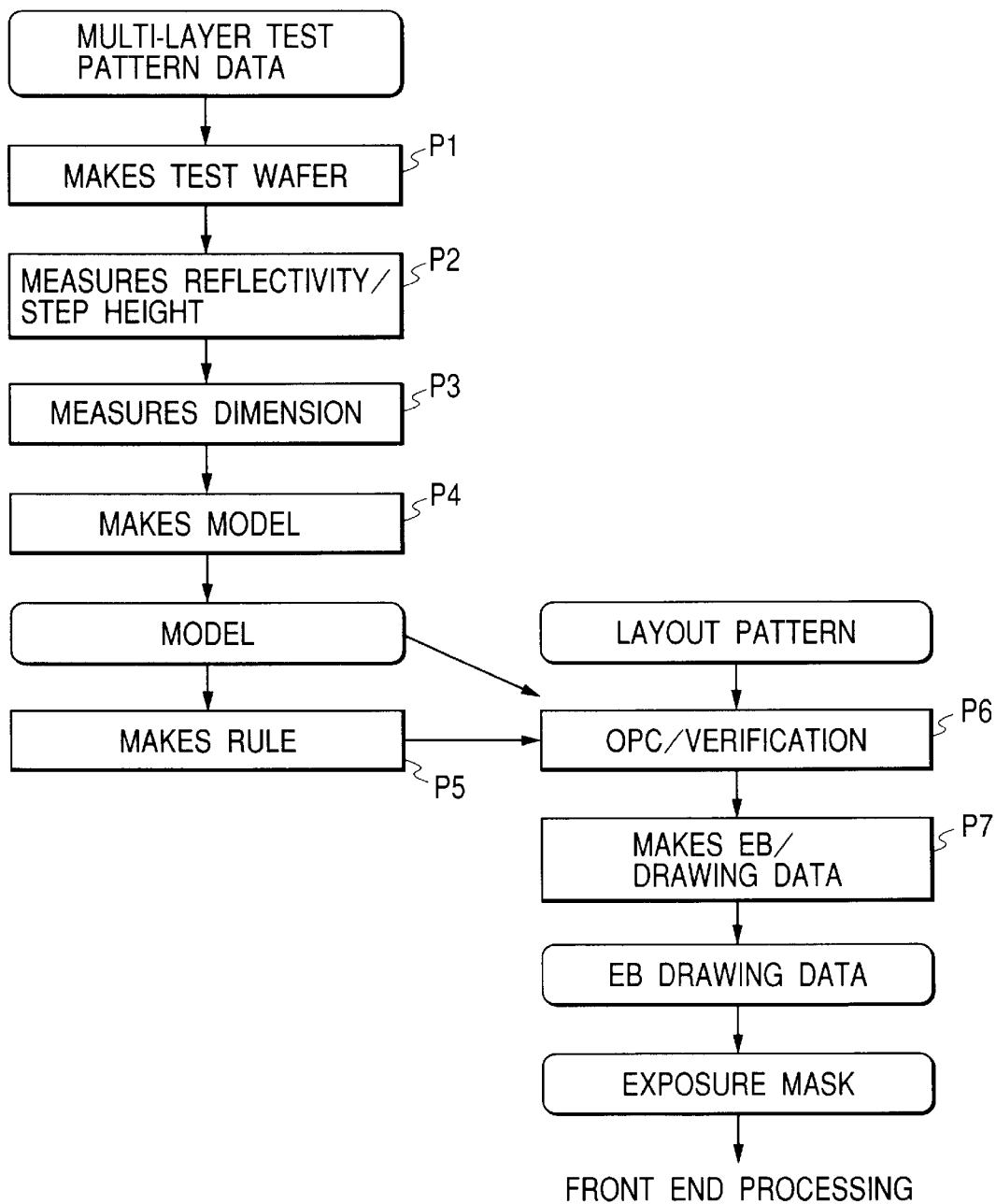
FIG. 9 is a flowchart showing a process, which is included in the semiconductor integrated circuit manufacturing process, of forming an exposure mask based on designed layout pattern data.

FIG. 9 shows by flowchart the exposure mask manufacturing process, which is based on designed layout pattern data, out of the manufacturing process for a semiconductor integrated circuit.

Initially, a test wafer is made by using the multi-layer test pattern data: (P1). The test wafer is dependent in its resulting test pattern shape and dimensions on the technical quality of manufacturer and the accuracy of processing machine. The test wafer undergoes the measurement of reflectivity and step height: (P2), and the measurement of dimensions of the test pattern: (P3).

The multi-layer test pattern data is also used to conduct optical simulation thereby to make a light intensity pattern, and a model, which defines compensation values correlative to the dimensional difference of the light intensity pattern from the test pattern, is made: (P4). Next, a rule of OPC is determined on the model: (P5). The rule includes the content of border treatment to be applied to the border section.

Optical simulation for the layout pattern is conducted in accordance with the model and OPC rule, thereby implementing the proximity effect correction of the layout pattern and the verification of the photomask pattern: (P6). The verification result is used to make EB (electron beam) drawing data which defines a mask pattern: (P7), and a photomask is made on the EB drawing data. The photomask is released for the subsequent wafer front-end processing.

Figure 10:
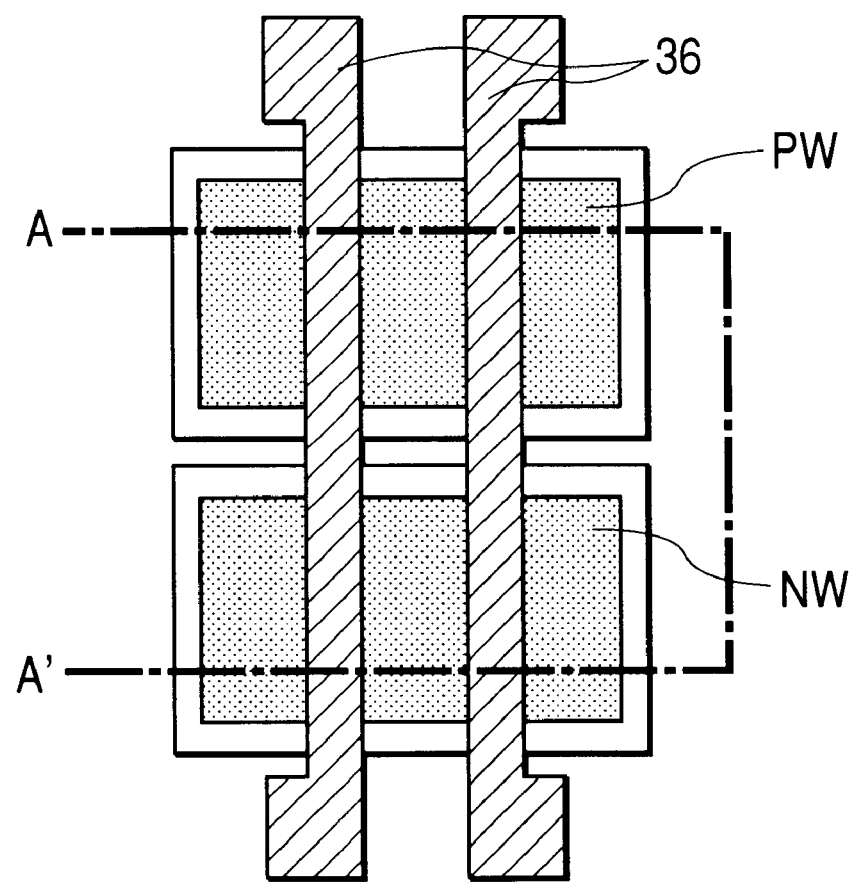
FIG. 10 is a plan view of a p-channel MOS transistor and an n-channel MOS transistor included in a CMOS integrated circuit.
Figure 11A:
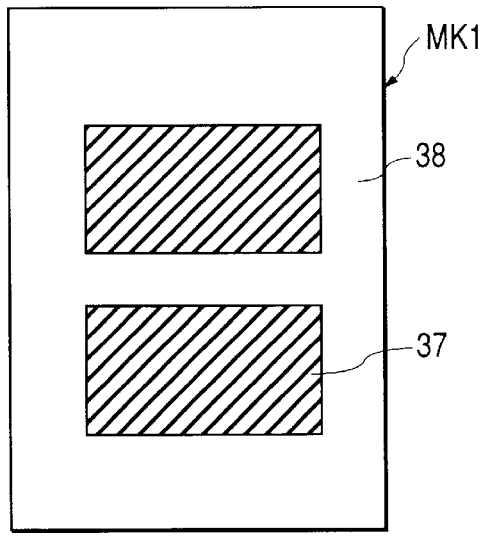
FIG. 11 is a set of diagrams used to explain principal exposure masks used for the manufacturing of the a p-channel and n-channel MOS transistors shown in FIG. 10.
Figure 11B:
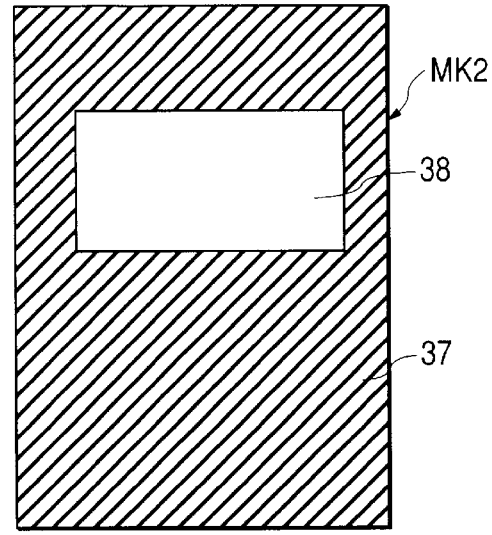
Figure 11C:
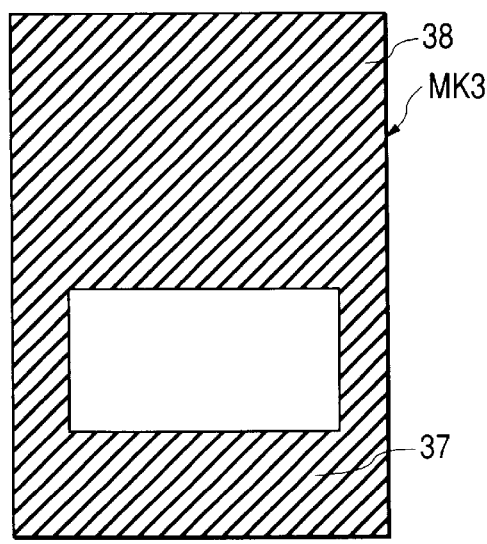
Figure 11D:
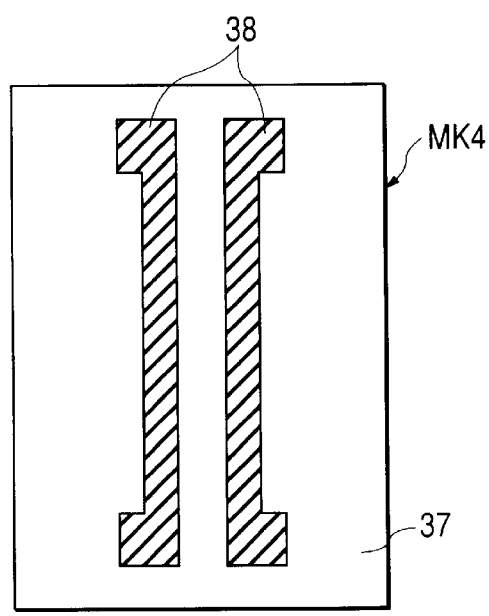
Figure 12A:
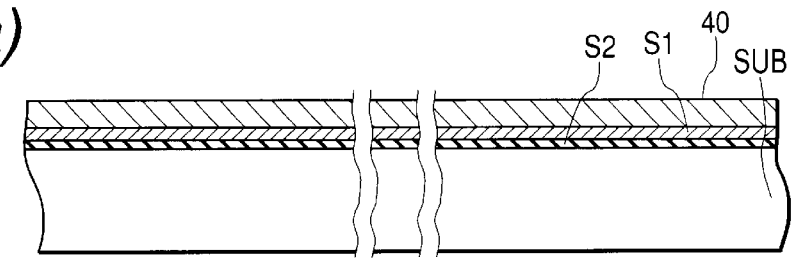
FIG. 12 is a set of cross-sectional diagrams showing sequentially the former half of a wafer manufacturing process which uses exposure masks MK1 through MK4.
Figure 12B:
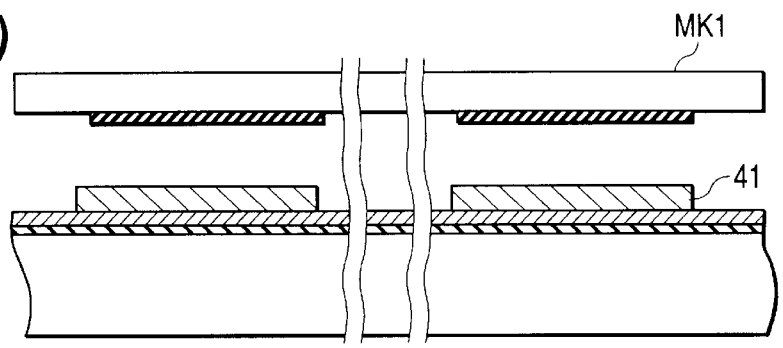
Figure 12C:
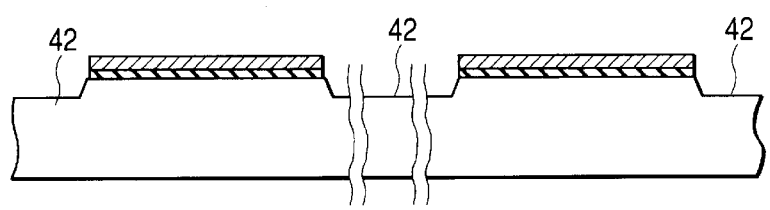
Figure 12D:
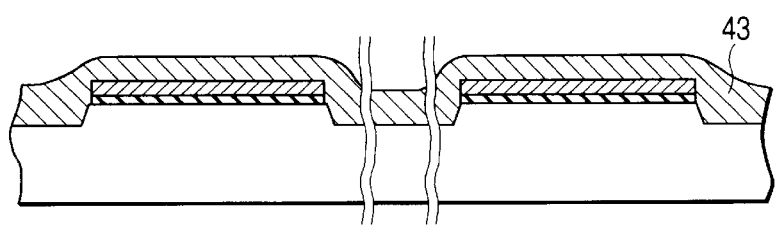
Figure 12E:
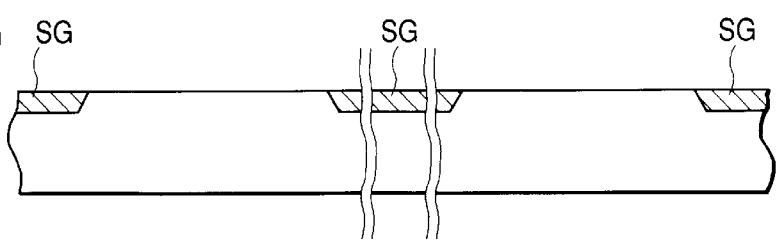
Figure 13F:
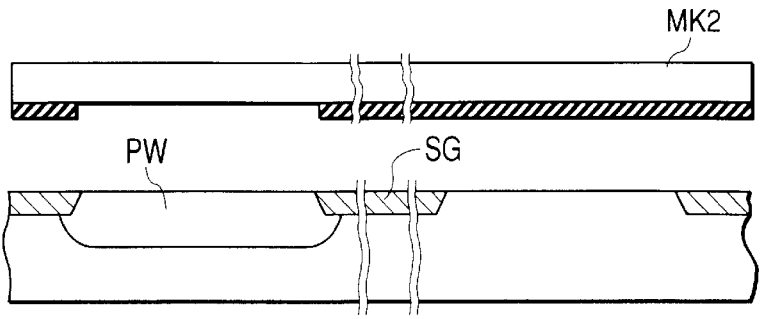
FIG. 13 is a set of cross-sectional diagrams showing sequentially the latter half of the wafer manufacturing process which uses the exposure masks MK1 through MK4.
Figure 13G:
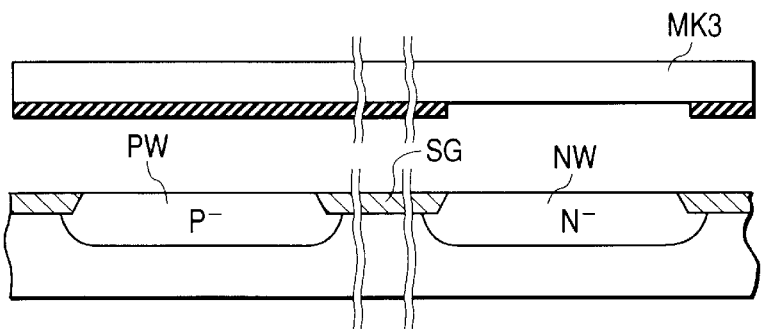
Figure 13H:
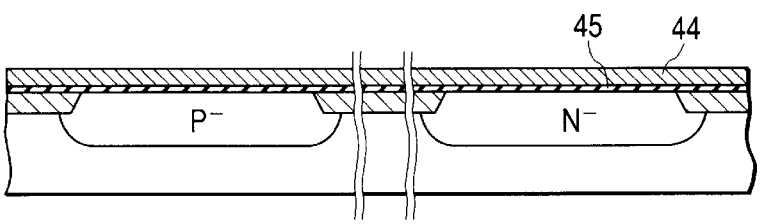
Figure 13I:
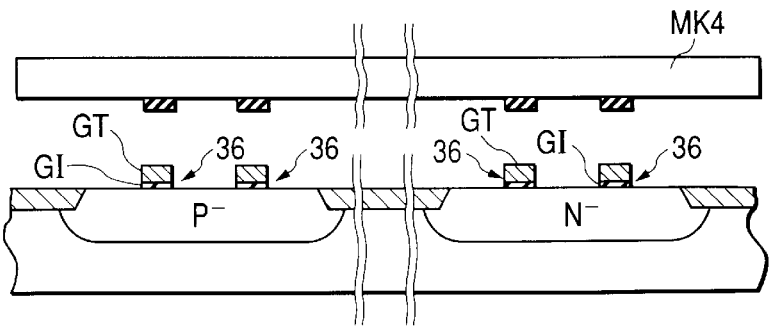
Figure 13J:
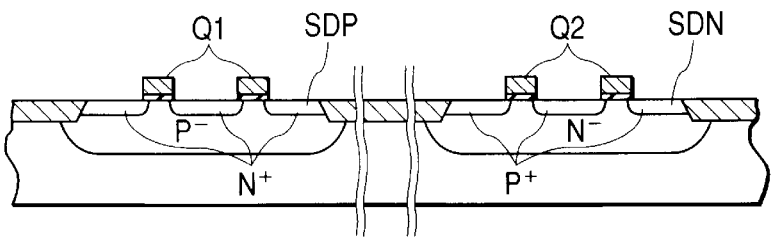

FIG. 10 shows by plan view a p-channel MOS transistor and an n-channel MOS transistor included in a CMOS integrated circuit. Shown in this figure are a p-type well region PW, an n-type well region NW, and gate electrodes 36.

FIG. 11 shows principal exposure masks used for the fabrication of the p-channel and n-channel MOS transistors of FIG. 10. Each exposure mask is a light-blocking pattern of photoresist or the like formed on the surface of a glass plate for example. Accordingly, the glass plate has a light-blocking pattern 37 shown by hatching and a light-passing surface 38.

Shown by (a) is exposure mask MK1 which is used to form separation grooves on a semiconductor substrate. Shown by (b) is exposure mask MK2 which is used to form the p-well region PW. Shown by (c) is exposure mask MK3 which is used to form the n-well region NW. Shown by (d) is exposure mask MK4 which is used to form the gate electrodes 36.

FIG. 12 and FIG. 13 are a set of cross-sectional diagrams of the CMOS integrated circuit taken along the line A–A' of FIG. 10, showing the sequential fabrication processes which use the exposure masks MK1–MK4.

As shown by (a) in FIG. 12, a p-type semiconductor substrate (semiconductor wafer) SUB having a resistivity of about 10 Ω cm is subjected to wet oxidation at about 800° C. thereby to form on its surface a thin silicon oxide film S2 of about 10 nm in thickness. The silicon oxide film S2 is intended to relax the stress of substrate SUB in the following process of sintering a silicon oxide film which fills the separation grooves. Subsequently, a silicon nitride film S1 of about 200 nm in thickness is deposited on it by the CVD (chemical vapor deposition) process. The silicon nitride film S1 which is resistant against oxidation is used as a mask for preventing the oxidation of the substrate surface beneath the active region. A photoresist film 40 is formed on the silicon nitride film S1.

Next, as shown by (b), a photoresist pattern 41 is formed by using the photomask MK1. The resulting photoresist mask is used to dry-etch the silicon nitride film S1, silicon oxide film S2 and substrate SUB, and separation grooves 42 of about 300–400 nm in depth are formed in the substrate SUB as shown by (c). The separation grooves 42 may be formed in an alternative manner of dry-etching the silicon nitride film S1 with the mask of photoresist film, removing the photoresist film, and dry-etching the silicon oxide film S2 and substrate SUB with the mask of silicon nitride film S1.

Next, as shown by (d), in order to remove a damaged layer which has been left by the dry-etching process on the inner wall of the separation grooves 42, the substrate SUB is subjected to dry-oxidation at about 1000° C., so that a silicon oxide film 43 is formed by a thickness about 30 nm to cover the inner wall of the separation grooves 42 and also deposited by a thickness of about 400 nm on the substrate SUB.

The substrate SUB is subjected to wet oxidation thereby to improve by sintering the quality of the silicon oxide film 43 filled in the separation grooves 42. The surface is abraded, while leaving the silicon oxide film 43 inside the separation grooves 42, and separators SG are completed as shown by (e).

Next, as shown by (f) in FIG. 13, a p-well region PW is formed on the substrate SUB based on ion implantation of impurity, e.g., boron, by use of the photomask MK2. Subsequently, as shown by (g), an n-well region NW is formed on the substrate SUB based on ion implantation of impurity, e.g., phosphor, by use of the photomask MK3. The resulting substrate SUB undergoes the heat process to activate the implanted impurities, thereby completing the n-well region NW and p-well region PW.

Next, as shown by (h), a gate insulating film (gate oxide film) 45 is formed on the main surface of the substrate SUB, and a conductor film 44 for gate electrodes is formed on the gate insulating film 45 by the CVD process or the like. The conductor film 44 is a low-resistance poly-silicon film, or a laminated film of a low-resistance poly-silicon film coated with tungsten silicide film, or a laminated film of a low-resistance poly-silicon film coated with a metallic film of such as tungsten by being interleaved by a barrier metallic film of such as tungsten nitride or titanium nitride.

Next, as shown by (i), the gate insulating film 45 and conductor film 44 are patterned into GT and GI by using the photomask MK4, thereby completing gate electrodes 36.

Next, as shown by (j), the p-well region PW is rendered the ion implantation of arsenic (As), for example, thereby to form n+ type semiconductor regions (source and drain regions) SDP for the n-channel MOS transistor Q1. The n-well region NW is rendered the ion implantation of boron (B), for example, thereby to form p+ type semiconductor regions (source and drain regions) SDN for the p-channel MOS transistor Q2. The resulting substrate SUB undergoes the heat process for the activation of impurities, thereby completing the p-channel MOS transistor Q2 and n-channel MOS transistor Q1.

A wiring layer is formed (not shown), and finally the wiring layer is overlaid with a passivation film.

The exposure masks (MK4, etc.) used in the foregoing processes have been verified by use of models which are based on the multi-layer test patterns explained previously. Since the influence of the underlay of pattern on the etching rate or the like, which has not been considered in the conventional optical simulation, can be taken into account based on the modeling in optical simulation, the simulation accuracy of layout patterns of gate electrodes can be improved.

Figure 14:
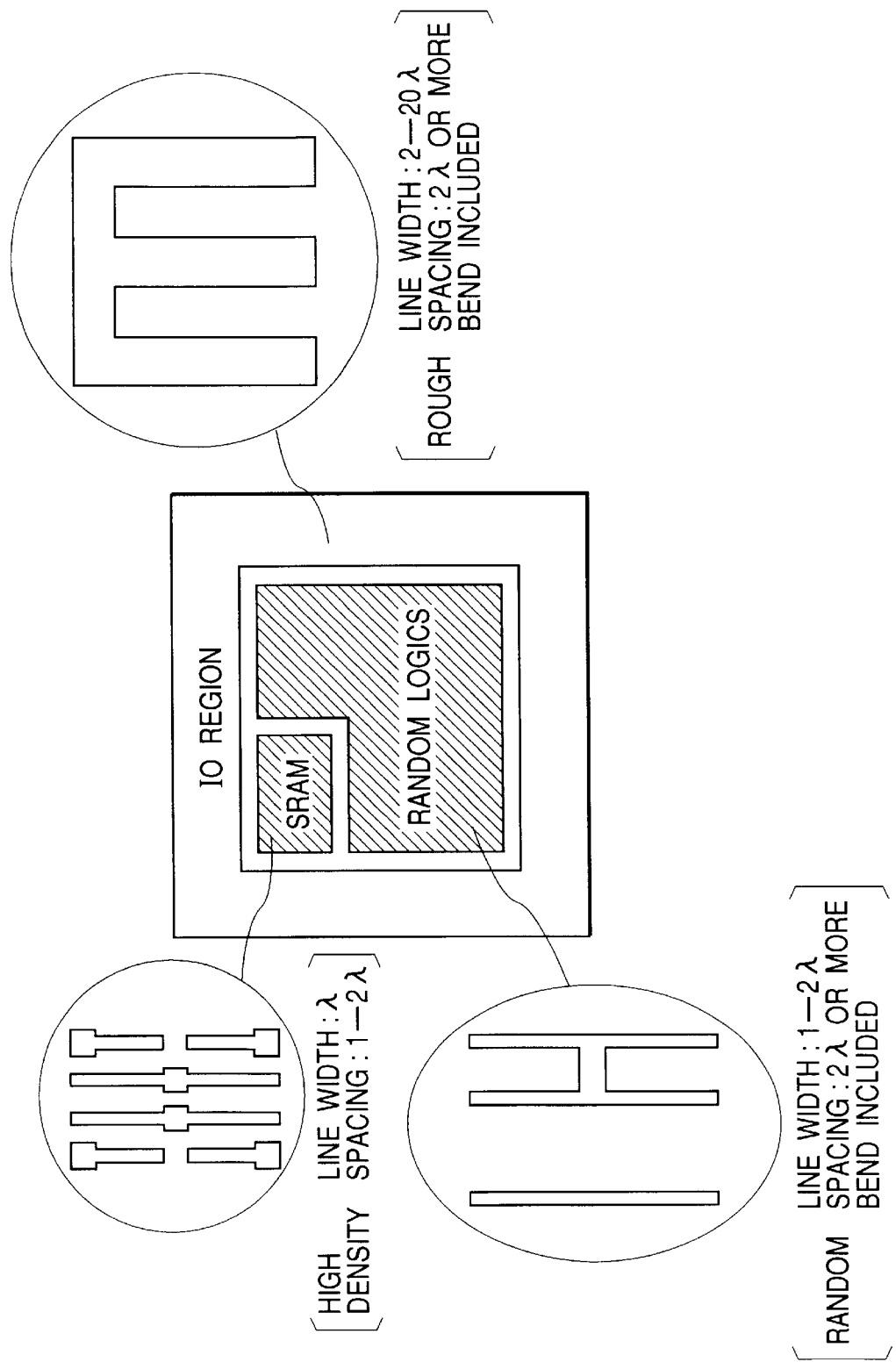
FIG. 14 is a diagram showing various gate electrode patterns used for a logic LSI.

There are a variety of gate electrode pattern. In a logic LSI of a microcomputer, as shown for example in FIG. 14, many kinds of work are required depending on the line density, line width, line spacing, shape, etc. For example, the SRAM section, which is high in density, has a line width of $\lambda$ and line spacings of $\lambda$–$2\lambda$ in terms of the critical dimension $\lambda$, whereas the random logic section is random in density, has line widths of $\lambda$–$2\lambda$ and line spacings of $2\lambda$ or more, and includes bends. The IO section is rough in pattern shape, has line widths of $2\lambda$–$20\lambda$ and line spacings of $2\lambda$ or more, and includes bends.

Figure 15:
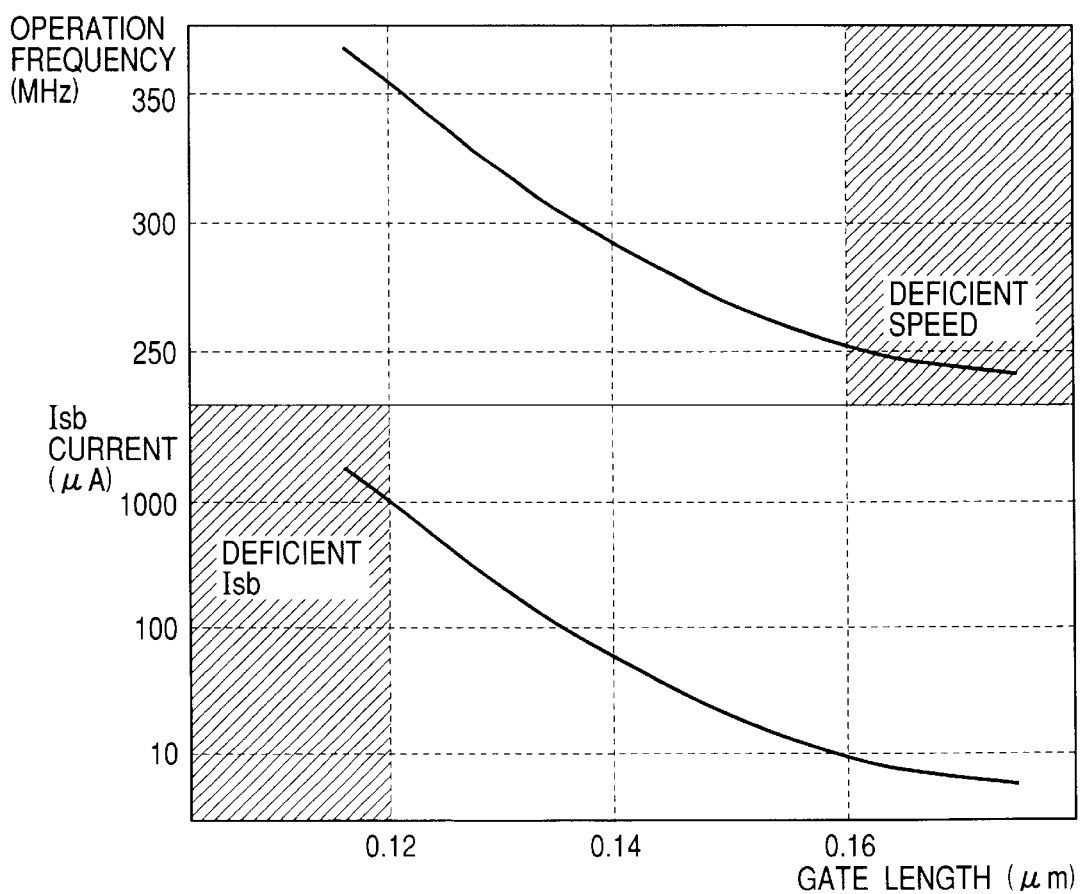
FIG. 15 is a graph used to explain the influence of gate length on the characteristics of MOS transistor.

In dealing with this situation, it is possible to have accurate assessment of patterns which will be made by gate electrode patterns based on the prior optical simulation. Accordingly, gate electrode patterns can be made in high working accuracy in compliance with design data based on the use of verified exposure masks. In consequence, the adverse influence of unexpected factors on the gate length of MOS transistors as shown for example in FIG. 15, i.e., a too wide gate electrode pattern which results in a slower operation of transistors, or a too narrow gate electrode pattern which results in an increased leakage current of transistors, can be prevented.

Although the specific embodiments of the present invention have been explained, the present invention is not confined to these embodiments, but can obviously be altered extensively without departing from the essence of the invention.

For example, pattern data used to make test patterns above different underlays on a semiconductor substrate is not confined to multi-layer pattern data, but can be pattern data of test masks which are made on a basis of the multi-layer pattern data. Test patterns are not confined to isolated lines or parallel lines, but can include bent patterns. Differences in underlays to be considered in making a multi-layer test pattern are not confined to the etching rate, reflectivity and step height among p+ regions, n+ regions and well regions, but other states of underlays may be taken into account.

The major effectiveness achieved by the present invention is briefed as follows.

The influence of the underlay of pattern on the etching rate, etc., which has not been considered in the conventional optical simulation, can be taken into account based on the use of models in optical simulation, and consequently the simulation accuracy of layout patterns of gate electrodes can be improved. Accordingly, gate electrode patterns of MOS transistors can be made accurately in compliance with design data based on the use of verified exposure masks for the gate electrode patterns.

What is claimed is:

1. A method of manufacturing a semiconductor integrated circuit which includes a MOS transistor:

assessing a shape of a gate electrode pattern of the MOS transistor of an exposure mask by optical simulation, and exposing a semiconductor substrate through the exposure mask, wherein a plurality of models according to different underlays are formed by comparing test patterns with light intensity patterns, wherein the optical simulation is corrected on a basis of a model which is selected from the plurality of models and defines compensation values correlative to dimensional differences of the light intensity patterns from the test patterns, and wherein the test patterns are formed on a basis of test pattern data above the different underlays on a surface of a test wafer and the light intensity patterns are formed by another optical simulation based on the test pattern data.

2. The method of manufacturing a semiconductor integrated circuit according to claim 1, wherein said different underlays are underlays which necessitate different etching rates.

3. The method of manufacturing a semiconductor integrated circuit according to claim 1, wherein said different underlays are underlays having different light reflectivities.

4. The method of manufacturing a semiconductor integrated circuit according to claim 1, wherein said models are made separately for individual underlay, said pattern shape assessment being implemented by using a model which is relevant to the underlay of the gate electrode pattern.

5. A method of manufacturing a semiconductor integrated circuit which includes a plurality of MOS transistors:

providing a first semiconductor region of a first conductivity type and a second semiconductor region of a second conductivity type along a surface of a semiconductor substrate; and exposing the semiconductor substrate through an exposure mask to form gate electrode patterns of the MOS transistors on the first and second semiconductor regions;

wherein shapes of the gate electrode patterns of the exposure mask are assessed by a first optical simulation which is corrected on a basis of a model which is selected from a plurality of models, wherein each of the plurality of models is formed by comparing test patterns with light intensity patterns and defines compensation values corrective to dimensional differences of the light intensity patterns from the test patterns according to different underlays, and wherein the test patterns are formed on basis of test pattern data on a third semiconductor region of a first conductivity type and a fourth semiconductor region of a second conductivity type along a surface of a test wafer and the light intensity patterns are formed by a second optical simulation based on the test pattern data.

6. The semiconductor integrated circuit manufacturing method according to claim 5, wherein the different underlays are underlays which necessitate different etching rates.

7. A semiconductor integrated circuit manufacturing method according to claim 5, wherein the different underlays are underlays having different light reflectivities.

* * * * *